(12) United States Patent
Konno et al.

(10) Patent No.: US 9,059,055 B2
(45) Date of Patent: Jun. 16, 2015

(54) SOLID-STATE IMAGING DEVICE

(71) Applicant: Kabushiki Kaisha Toshiba, Tokyo (JP)

(72) Inventors: Yusaku Konno, Kanagawa-ken (JP); Moto Yabuki, Mie-ken (JP); Naotada Okada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/759,254

(22) Filed: Feb. 5, 2013

(65) Prior Publication Data
US 2013/0200480 A1 Aug. 8, 2013

(30) Foreign Application Priority Data

Feb. 7, 2012 (JP) ................................. 2012-024095

(51) Int. Cl.
*H01L 31/0232* (2014.01)
*H01L 27/146* (2006.01)

(52) U.S. Cl.
CPC .... *H01L 27/14607* (2013.01); *H01L 27/14647* (2013.01)

(58) Field of Classification Search
CPC . H01L 27/144; H01L 27/1446; H01L 27/146; H01L 27/14607; H01L 27/1463; H01L 27/14643
USPC .......................................................... 257/436
See application file for complete search history.

(56) References Cited

U.S. PATENT DOCUMENTS

| 3,763,372 A * | 10/1973 | Fedotowsky et al. | 257/280 |
| 7,847,362 B2 * | 12/2010 | Ogino et al. | 257/436 |
| 2007/0044829 A1 * | 3/2007 | Osaka et al. | 136/249 |

(Continued)

FOREIGN PATENT DOCUMENTS

| CN | 101546778 A | 9/2009 |
| JP | 2007-234651 | 9/2007 |
| JP | 2007-234651 A | 9/2007 |

(Continued)

OTHER PUBLICATIONS

Office Action dated Feb. 17, 2015 issued in corresponding Chinese patent application No. 20130088102.9 (with English translation).

(Continued)

*Primary Examiner* — Matthew Landau
*Assistant Examiner* — Eric Ashbahian
(74) *Attorney, Agent, or Firm* — Oblon, McClelland, Maier & Neustadt, L.L.P.

(57) ABSTRACT

According to one embodiment, a solid-state imaging device includes a first structure part, a second structure part, and a third structure part. The first structure part includes a first insulating body and a first photoelectric conversion part. The first photoelectric conversion part is periodically disposed in the first insulating body and selectively absorbs light in the first wavelength band. The second structure part includes a second insulating body and a second photoelectric conversion part. The second photoelectric conversion part is periodically disposed in the second insulating body and selectively absorbs light in the second wavelength band. The third structure part includes a third photoelectric conversion part. The third photoelectric conversion part absorbs light in a third wavelength band. When viewed in the light incidence direction, the first photoelectric conversion part, the second photoelectric conversion part, and the third photoelectric conversion part are disposed in this order.

19 Claims, 14 Drawing Sheets

(56) References Cited

U.S. PATENT DOCUMENTS

| | | |
|---|---|---|
| 2009/0242736 A1 | 10/2009 | Rennie |
| 2010/0123811 A1 | 5/2010 | Abe |
| 2010/0308428 A1* | 12/2010 | Okamoto et al. ............. 257/432 |
| 2011/0155891 A1* | 6/2011 | Yamamoto ................ 250/208.1 |
| 2011/0174958 A1* | 7/2011 | Weststrate et al. ......... 250/208.1 |
| 2012/0049044 A1* | 3/2012 | Kuboi ....................... 250/208.1 |

FOREIGN PATENT DOCUMENTS

| | | |
|---|---|---|
| JP | 2009-238942 A | 10/2009 |
| KR | 10-2010-0055323 A | 5/2010 |

OTHER PUBLICATIONS

Korean Office Action issued Dec. 12, 2013, in Korean Patent Application No. 10-2013-13768 with English translation.

* cited by examiner

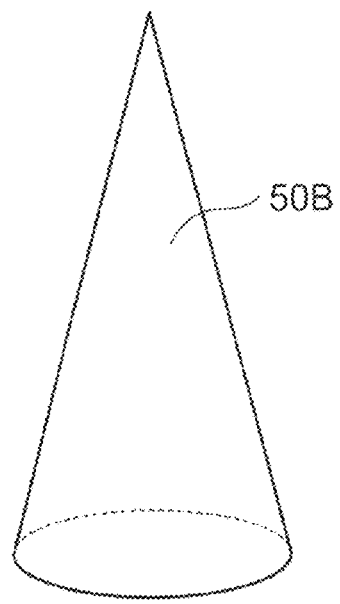
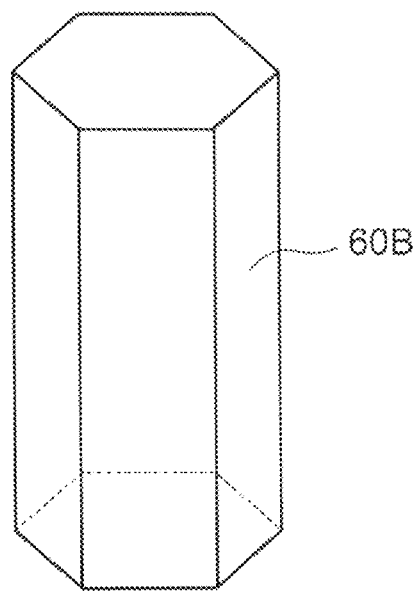
FIG. 16A  FIG. 16B
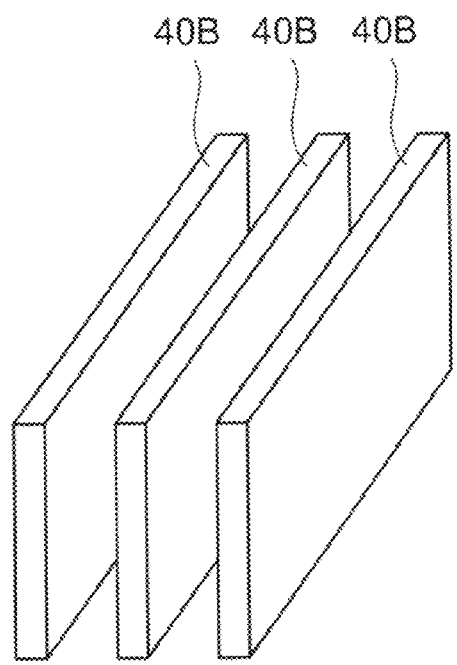
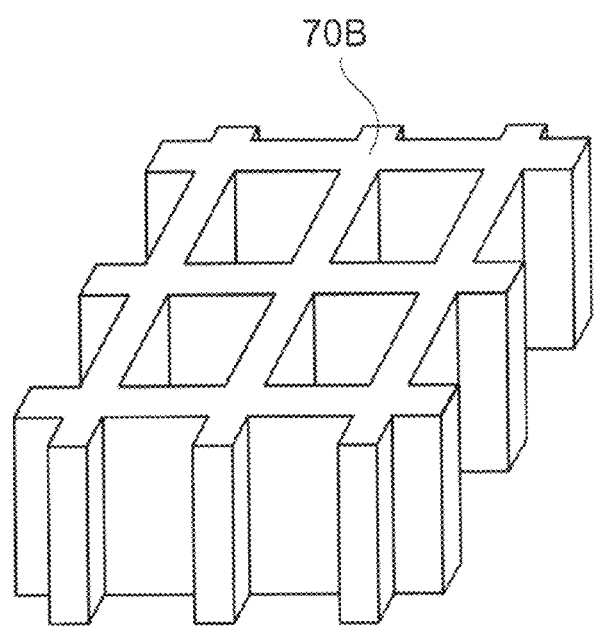
FIG. 16C  FIG. 16D

US 9,059,055 B2

SOLID-STATE IMAGING DEVICE

CROSS-REFERENCE TO RELATED APPLICATIONS

This application is based upon and claims the benefit of priority from the prior Japanese Patent Application No. 2012-024095, filed on Feb. 7, 2012; the entire contents of which are incorporated herein by reference.

FIELD

Embodiments described herein relate generally to a solid-state imaging device.

BACKGROUND

In recent years, a solid-state imaging device has been applied in a broad range of fields including various mobile terminals such as a digital camera and a mobile phone; a surveillance camera; a web camera for chatting via the Internet; and the like.

Examples of the solid-state imaging device include a Complementary Metal Oxide Semiconductor (CMOS) area sensor, a Charge-Coupled Device (CCD) area sensor, and the like. Such solid-state imaging devices require pixel miniaturization in order to achieve a higher resolution.

However, there is a problem in which furthermore pixel miniaturization causes a decrease in the amount of received light of a photoelectric conversion part having, for example, a photodiode.

BRIEF DESCRIPTION OF THE DRAWINGS

FIG. 16A to FIG. 16D are schematic perspective views illustrating modifications of shape of the photoelectric conversion part in the embodiment.

DETAILED DESCRIPTION

Figure 1:
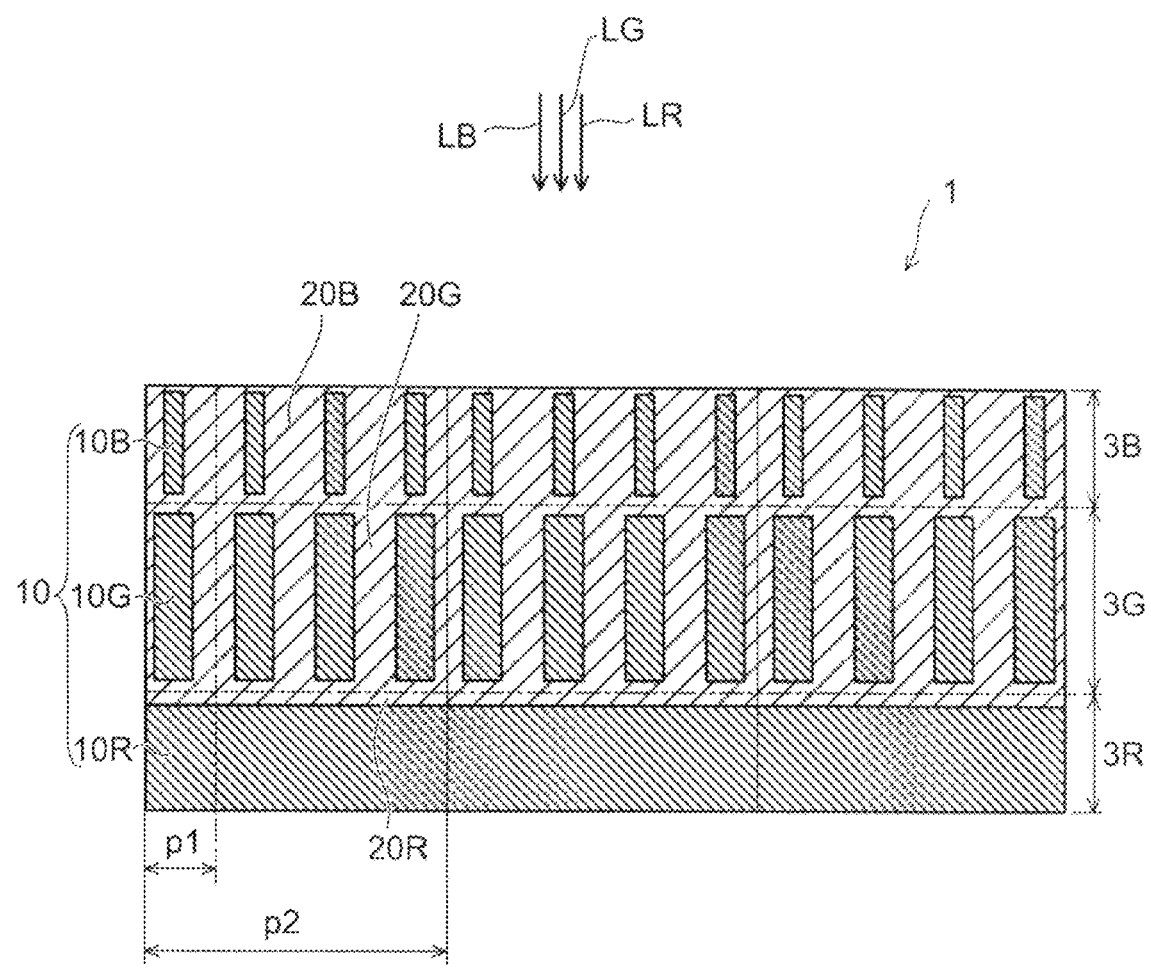
FIG. 1 is a schematic sectional view showing a solid-state imaging device according to an embodiment of the invention.

According to one embodiment, a solid-state imaging device includes a first structure part, a second structure part, and a third structure part. The first structure part includes a first insulating body and a first photoelectric conversion part. The first photoelectric conversion part is periodically disposed in the first insulating body. The first photoelectric conversion part has a shape corresponding to a first wavelength band. The first photoelectric conversion part selectively absorbs light in the first wavelength band due to a waveguide effect. The second structure part includes a second insulating body and a second photoelectric conversion part. The second photoelectric conversion part is periodically disposed in the second insulating body. The second photoelectric conversion part has a shape corresponding to a second wavelength band that is different from the first wavelength band. The second photoelectric conversion part selectively absorbs light in the second wavelength band due to the waveguide effect. The third structure part includes a third photoelectric conversion part. The third photoelectric conversion part absorbs light in a third wavelength band. The third wavelength band is different from the first wavelength band and the second wavelength band. When viewed in the light incidence direction, the first photoelectric conversion part, the second photoelectric conversion part, and the third photoelectric conversion part are disposed in this order.

Embodiments of the invention will now be described with reference to the drawings. In the drawings, similar components are labeled with like reference numerals, and the detailed description thereof is omitted appropriately.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

FIG. 1 is a schematic sectional view showing a solid-state imaging device according to an embodiment of the invention.

Figure 2:
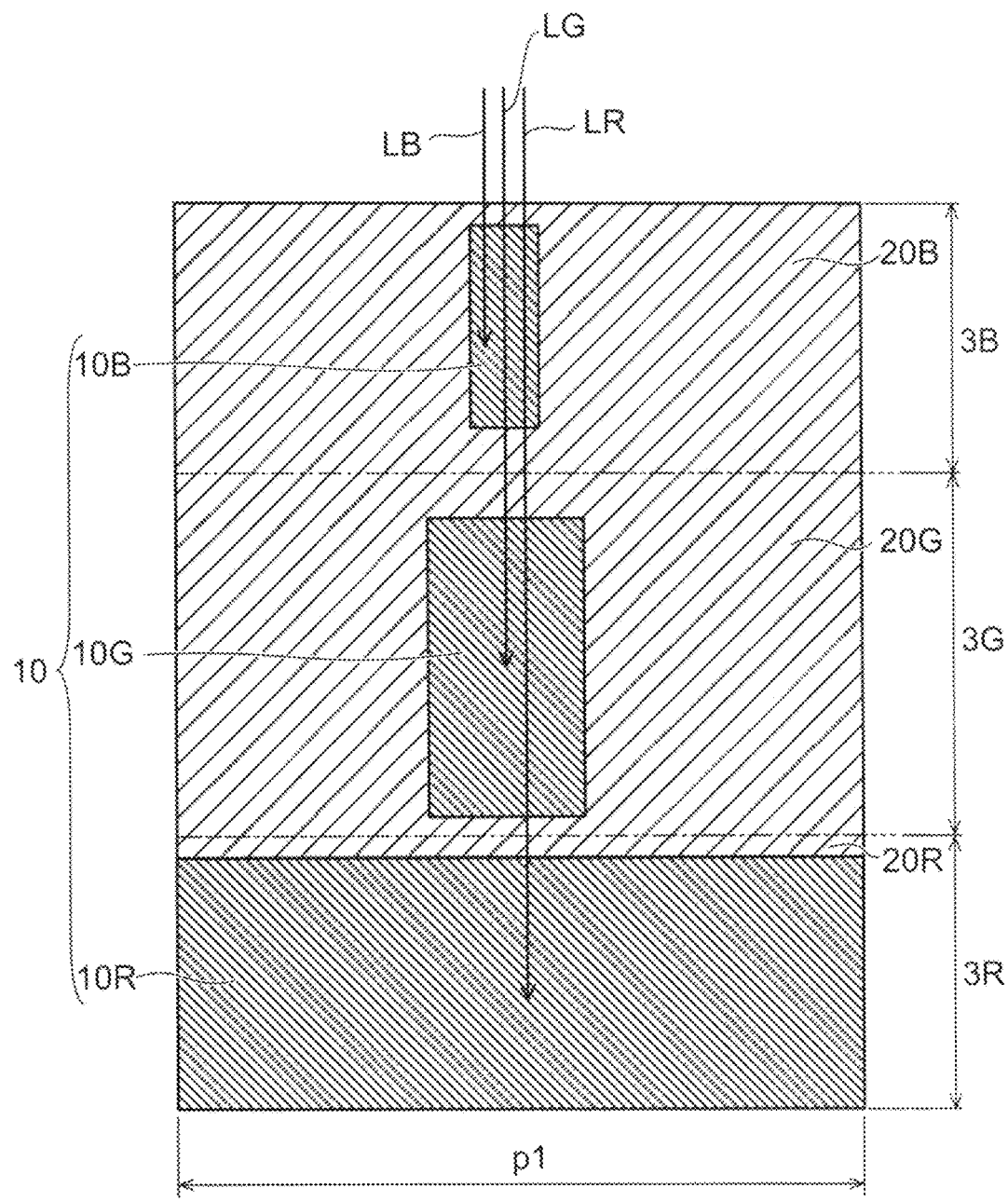
FIG. 2 is a schematic sectional view showing the solid-state imaging device of one period structure according to the embodiment.

FIG. 2 is a schematic sectional view showing the solid-state imaging device of one period structure according to the embodiment.

As shown in FIG. 1, the solid-state imaging device 1 according to the embodiment includes a first structure part (first period structure part) 3B, a second structure part (second period structure part) 3G, and a third structure part (bulk structure part) 3R. When the solid-state imaging device 1 is viewed in a light incidence direction (a direction from the upside to the downside in FIG. 1 and FIG. 2), the first structure part 3B, the second structure part 3G, and the third structure part 3R are stacked in this order.

The first structure part 3B has a first insulating body 20B as a foundation layer, and first photoelectric conversion part 10B. The second structure part 3G has a second insulating body 20G as a foundation material, and second photoelectric conversion part 10G. The third structure part 3R has a third insulating body 20R, and a third photoelectric conversion part 10R. However, the third structure part 3R may be formed by only the third photoelectric conversion part 10R, and does not need to have the third insulating body 20R. In addition, the first insulating body 20B, the second insulating body 20G, and the third insulating body 20R may be formed of the same material or different materials. Furthermore, the first insulating body 20B, the second insulating body 20G, and the third insulating body 20R may be formed in the same process or different processes from each other.

The first structure part 3B has a structure in which the plurality of first photoelectric conversion parts 10B are periodically disposed. In addition, the second structure part 3G has a structure in which the plurality of second photoelectric conversion parts 10G are periodically disposed. When the solid-state imaging device 1 is viewed in the incidence direction, the plurality of first photoelectric conversion parts 10B and the plurality of second photoelectric conversion parts 10G are two-dimensionally disposed in a matrix (grid or honeycomb) manner. For example, the first photoelectric conversion part 10B and the second photoelectric conversion part 10G are squarely or hexagonally disposed.

As shown in FIG. 1, a set of the first photoelectric conversion part 10B, the second photoelectric conversion part 10G, and the third photoelectric conversion part 10R corresponds to one period (pitch) p1. Then, a group of the plurality of periods p1 corresponds to one pixel p2. In the solid-state imaging device 1 shown in FIG. 1, a group of four periods (p1×4), that is, four sets of the first photoelectric conversion part 10B, the second photoelectric conversion part 10G, and the third photoelectric conversion part 10R correspond to one pixel p2. However, relationship between the period p1 and the pixel p2 is not limited to this.

The photoelectric conversion part 10 (the first photoelectric conversion part 10B, the second photoelectric conversion part 10G, and the third photoelectric conversion part 10R) includes, for example, a photodiode. The photodiode used as the photoelectric conversion part 10 is formed of, for example, silicon (Si), polycrystalline silicon, amorphous silicon, or germanium (Ge), and has PN-junction.

The first to third insulating bodies 20B, 20G, and 20R each are formed of, for example, silicon oxide ($SiO_2$). Alternatively, the first to third insulating bodies 20B, 20G, and 20R may be air or vacuum.

The third photoelectric conversion part 10R as a substrate or the like is provided in a lower portion of the solid-state imaging device 1. That is, the third photoelectric conversion part 10R has a bulk structure. The first photoelectric conversion part 10B is provided in the first insulating body 20B. The second photoelectric conversion part 10G is provided in the second insulating body 20G. In other words, the first photoelectric conversion part 10B and the second photoelectric conversion part 10G are embedded in the first insulating body 20B and the second insulating body 20G, respectively.

The first photoelectric conversion part 10B and the second photoelectric conversion part 10G each have a pillar shape. The second photoelectric conversion part 10G is provided on the third photoelectric conversion part 10R. In addition, the first photoelectric conversion part 10B is provided on the second photoelectric conversion part 10G. That is, when the solid-state imaging device 1 is viewed in the light incidence direction, the first photoelectric conversion part 10B, the second photoelectric conversion part 10G, and the third photoelectric conversion part 10R are provided in this order. As shown in FIG. 1, a longitudinal direction of each of the first photoelectric conversion part 10B and the second photoelectric conversion part 10G is substantially parallel to the light incidence direction.

The first photoelectric conversion part 10B and the second photoelectric conversion part 10G are subjected to microfabrication. Specifically, the first photoelectric conversion part 10B and the second photoelectric conversion part 10G each have shape and size that correspond to wavelength band light incident on the solid-state imaging device 1. That is, the first photoelectric conversion part 10B has a wavelength dependency, and has the shape that exhibits a high absorbing property with respect to, for example, light in a blue band (first wavelength band). The second photoelectric conversion part 10G has a wavelength dependency, and has a high absorbing property with respect to, for example, light in green band (second wavelength band). The first photoelectric conversion part 10B and the second photoelectric conversion part 10G each have, for example, a cylindrical shape. A diameter of an upper face (light incidence face) of the first photoelectric conversion part 10B is, for example, about 0.06 micrometer (μm). A height of the first photoelectric conversion part 10B is, for example, about 1.4 μm. A diameter of an upper face of the second photoelectric conversion part 10G is, for example, about 0.09 μm. In addition, a height of the second photoelectric conversion part 10G is, for example, about 3.0 μm. Then, the first photoelectric conversion part 10B and the second photoelectric conversion part 10G can selectively absorb only light having a particular resonance wavelength. That is, the first photoelectric conversion part 10B and the second photoelectric conversion part 10G can selectively receive (absorb) light in different respective wavelength bands due to a waveguide effect.

As shown in FIG. 2, the first photoelectric conversion part 10B selectively absorbs light LB in the blue band among light incident on the solid-state imaging device 1, and selectively allows light in the other wavelength bands (ex. light LG in the green band and light LR in a red band) to transmit. The second photoelectric conversion part 10G selectively absorbs the light LG in the green band among light incident on the light incident on the solid-state imaging device 1, and selectively allows light in the other wavelength bands (ex. the light LR in the red band) to transmit. The third photoelectric conversion part 10R absorbs the light LR in the red band (third wavelength band) among the light incident on the solid-state imaging device 1.

That is, the first structure part 3B provided with the first photoelectric conversion part 10B functions as a filter that selectively absorbs the light LB in the blue band, and that selectively allows the light LG in the green band and the light LR in the red band to transmit. The second structure part 3G provided with the second photoelectric conversion part 10G functions as a filter that selectively absorbs the light LG in the green band, and that selectively allows the light LR in the red band to transmit. The third structure part 3R provided with the third photoelectric conversion part 10R may selectively absorb only the light LR in the red band, or may absorb the light LR as well as light having other wavelengths.

Here, selective absorbance efficiency and selective transmittance efficiency are not necessarily required to be 100%. That is, in the case where the absorptance to light having a particular wavelength is higher than the absorptance to light having the other wavelengths, it can be said that the light having the particular wavelength is selectively absorbed. The same also applies to selective transmittance.

For example, the first photoelectric conversion part 10B has only to have a higher absorptance to the light LB than absorptances to the light LG and the light LR.

In this way, the light absorbed by the first photoelectric conversion part 10B, the second photoelectric conversion part 10G, and the third photoelectric conversion part 10R is photoelectrically converted. Then, an electric signal (pixel signal) caused by the photoelectric conversion is sent to a peripheral circuit not shown.

Transistors constituting a signal processing circuit and a drive control circuit are provided in a peripheral circuit area not shown in the solid-state imaging device 1. The signal processing circuit processes the electric signal (pixel signal) that is photoelectrically converted by the photoelectric conversion part 10 and is outputted therefrom. The drive control circuit controls driving of the photoelectric conversion part 10.

Figure 3:
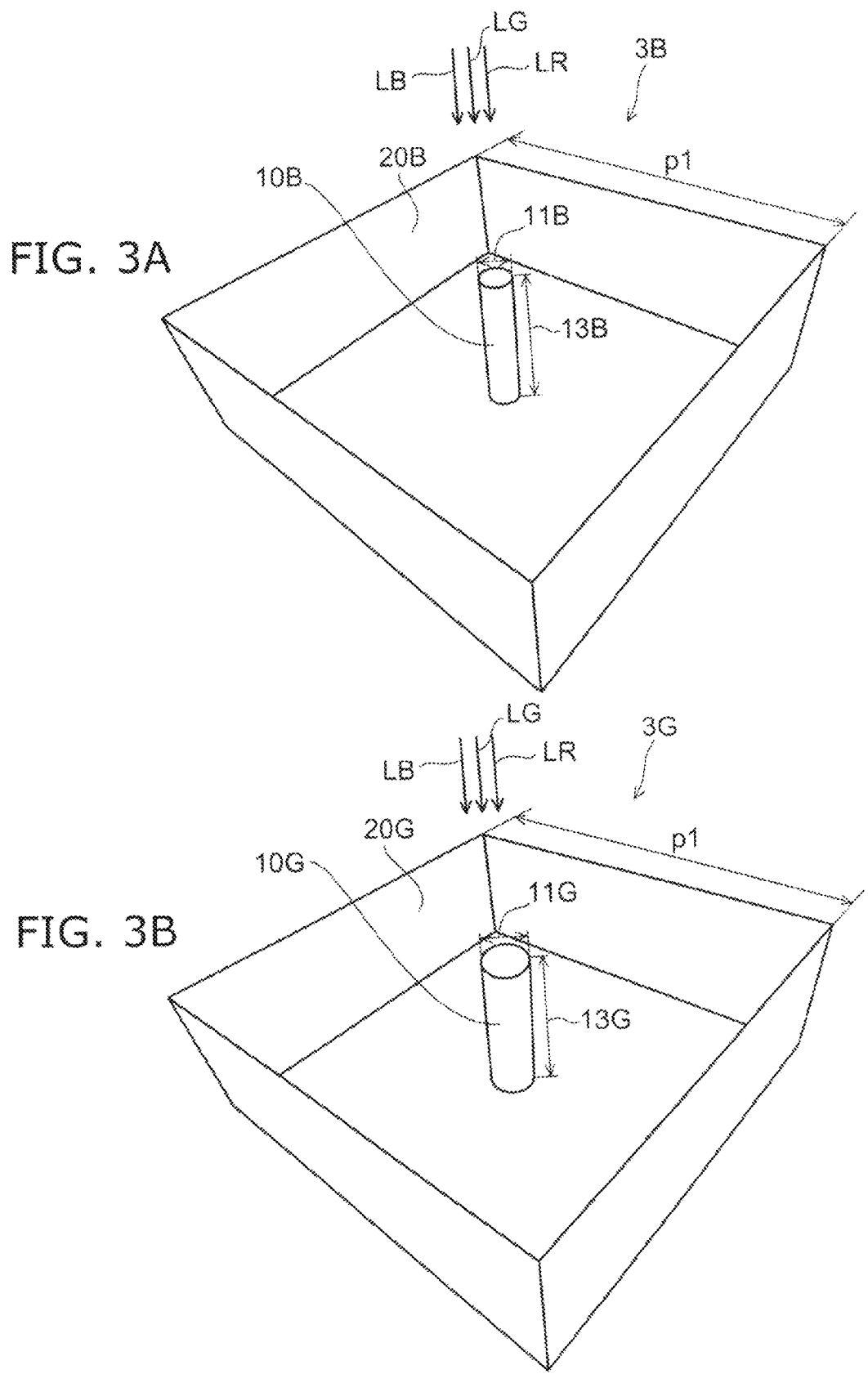
FIG. 3A and FIG. 3B are schematic perspective views illustrating a model of simulation about absorptance and transmittance of light in the photoelectric conversion part.

FIG. 3A and FIG. 3B are schematic perspective views illustrating a model of simulation about absorptance and transmittance of light in the photoelectric conversion part.

Figure 4:
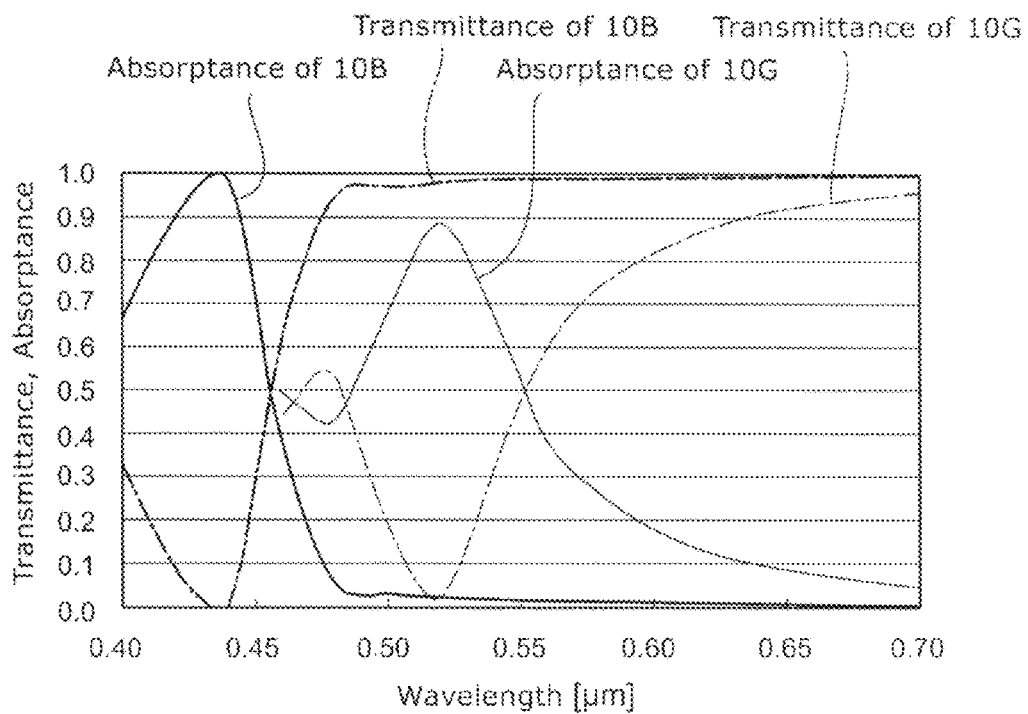
FIG. 4 is a graph illustrating a result of the simulation about the absorptance and the transmittance of the light in the photoelectric conversion part.

FIG. 4 is a graph illustrating a result of the simulation about the absorptance and the transmittance of the light in the photoelectric conversion part.

Figure 5:
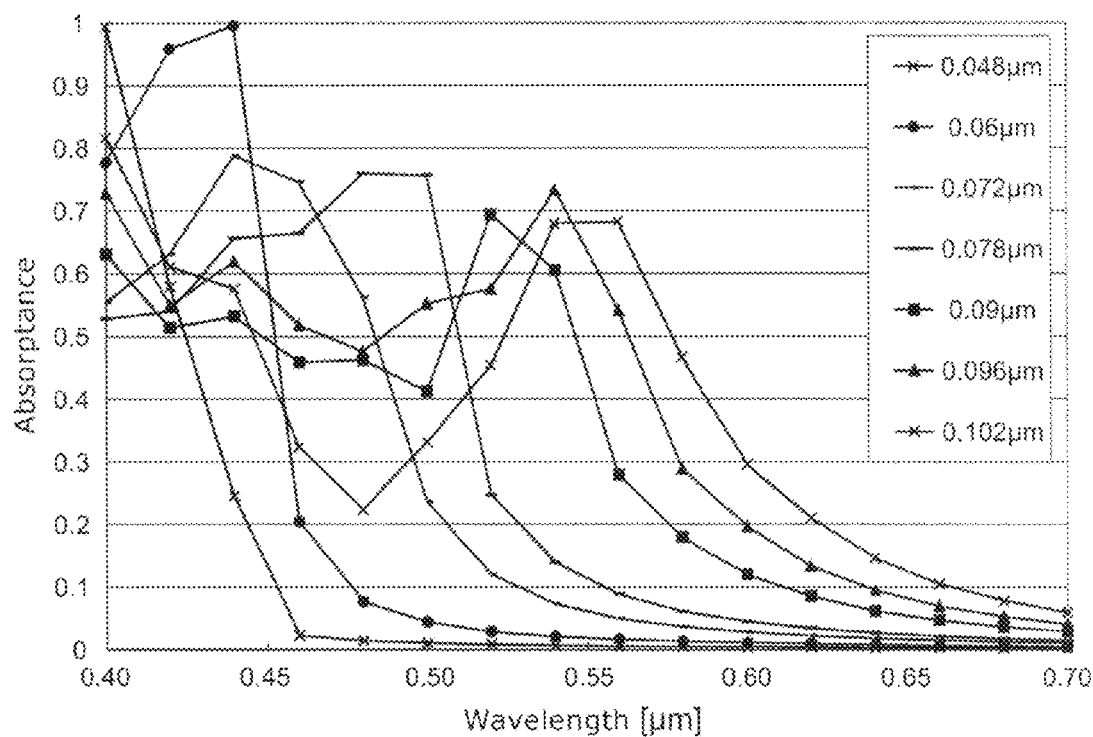
FIG. 5 is a graph illustrating a result of the simulation about the absorptance of the light in the photoelectric conversion part.

FIG. 5 is a graph illustrating a result of the simulation about the absorptance of the light in the photoelectric conversion part.

FIG. 3A is a schematic perspective view showing the first structure part 3B of one period structure. FIG. 3B is a schematic perspective view showing the second structure part 3G of one period structure.

As shown in FIG. 3A and FIG. 3B, the first photoelectric conversion part 10B and the second photoelectric conversion part 10G of the model in the simulation each have a cylindrical shape.

A diameter 11B of the light incidence face (frontage) of the first photoelectric conversion part 10B is about 0.06 μm. A height 13B of the first photoelectric conversion part 10B is about 1.4 μm. That is, a ratio (Aspect Ratio (AR)) of the diameter 11B to the height 13B is about 23.3. The period p1 is about 0.3 μm.

A diameter 11G of the light incidence face of the second photoelectric conversion part 10G is about 0.09 μm. A height 13G of the second photoelectric conversion part 10G is about 3.0 μm. That is, a ratio (AR) of the diameter 11G to the height 13G is about 33.3. The period p1 is about 0.3 μm.

The photoelectric conversion part 10 in the simulation is formed of crystalline silicon (Si). The first insulating body 20B and the second insulating body 20G are formed of silicon oxide ($SiO_2$) in the simulation.

Under such conditions, the inventor has obtained, through the simulation, the light transmittance and absorptance of the photoelectric conversion part at the time of incidence of the light LB, LG, LR shown in FIG. 3A and FIG. 3B on the solid-state imaging device 1. The result of the simulation is shown in FIG. 4.

That is, the absorptance at which the first photoelectric conversion part 10B absorbs light in the wavelength band of not less than about 0.40 μm and less than about 0.50 μm is higher than the absorptance at which the first photoelectric conversion part 10B absorbs light in the other wavelength bands. In other words, the light in the wavelength band of not less than about 0.40 μm and less than about 0.50 μm is easier to be absorbed than the light in the other wavelength bands, in the first photoelectric conversion part 10B. Furthermore, the absorptance at which the second photoelectric conversion part 10G absorbs light in the wavelength band of not less than about 0.50 μm and less than about 0.60 μm is higher than the absorptance at which the second photoelectric conversion part 10G absorbs light in the other wavelength bands. In other words, the light in the wavelength band of not less than about 0.50 μm and less than about 0.60 μm is easier to be absorbed than the light in the other wavelength bands, in the second photoelectric conversion part 10G.

In this way, the first photoelectric conversion part 10B that has a diameter of 0.06 μm and a height of 1.4 μm and that is disposed at a period of 0.3 μm exhibits a relatively high absorbing property with respect to the light in the wavelength band of not less than about 0.40 μm and less than about 0.50 μm (the light LB in the blue band). The second photoelectric conversion part 10G that has a diameter of 0.09 μm and a height of 3.0 μm and that is disposed at a period of 0.3 μm exhibits a relatively high absorbing property with respect to the light in the wavelength band of not less than about 0.50 μm and less than about 0.60 μm (the light LG in the green band).

That is, by the change of size (diameter of the light incidence face or height of the cylinder) of the cylindrical photoelectric conversion part 10 having a relatively high aspect ratio, the optical wavelength band that exhibits a high absorbing property can be changed. Alternatively, by changing the period p1, the optical wavelength band that exhibits a high absorbing property can be changed. Therefore, the inventor has obtained, through the simulation, a change in the optical absorptance of the photoelectric conversion part 10, which is caused by a change in the diameter of the light incidence face of the photoelectric conversion part 10. The heights 13B and 13G and the period p1 of the first photoelectric conversion part 10B and the second photoelectric conversion part 10G are the same as those describe above. A result of the simulation is shown in FIG. 5.

That is, when the diameter of the light incidence face of the photoelectric conversion part 10 is increased, the optical wavelength band that exhibits a high absorbing property becomes a band having a longer wavelength. Then, when the diameter 11B of the first photoelectric conversion part 10B provided in the first structure part 3B is about 0.06 μm, the first photoelectric conversion part 10B exhibits a relatively high absorbing property with respect to the light of not less than about 0.40 μm and less than about 0.50 μm (the light LB in the blue band). In contrast, when the diameter 11G of the second photoelectric conversion part 10G provided in the second structure part 3G is about 0.09 μm, the second photoelectric conversion part 10G exhibits a relatively high absorbing property with respect to the light of not less than about 0.50 μm and less than about 0.60 μm (the light LG in the green band). That is, when the diameter 11G of the second photoelectric conversion part 10G provided in the second structure part 3G is about 1.5 times as large as the diameter 11B of the first photoelectric conversion part 10B, the light LB in the blue band and the light LG in the green band can be separated from each other more efficiently.

Figure 6:
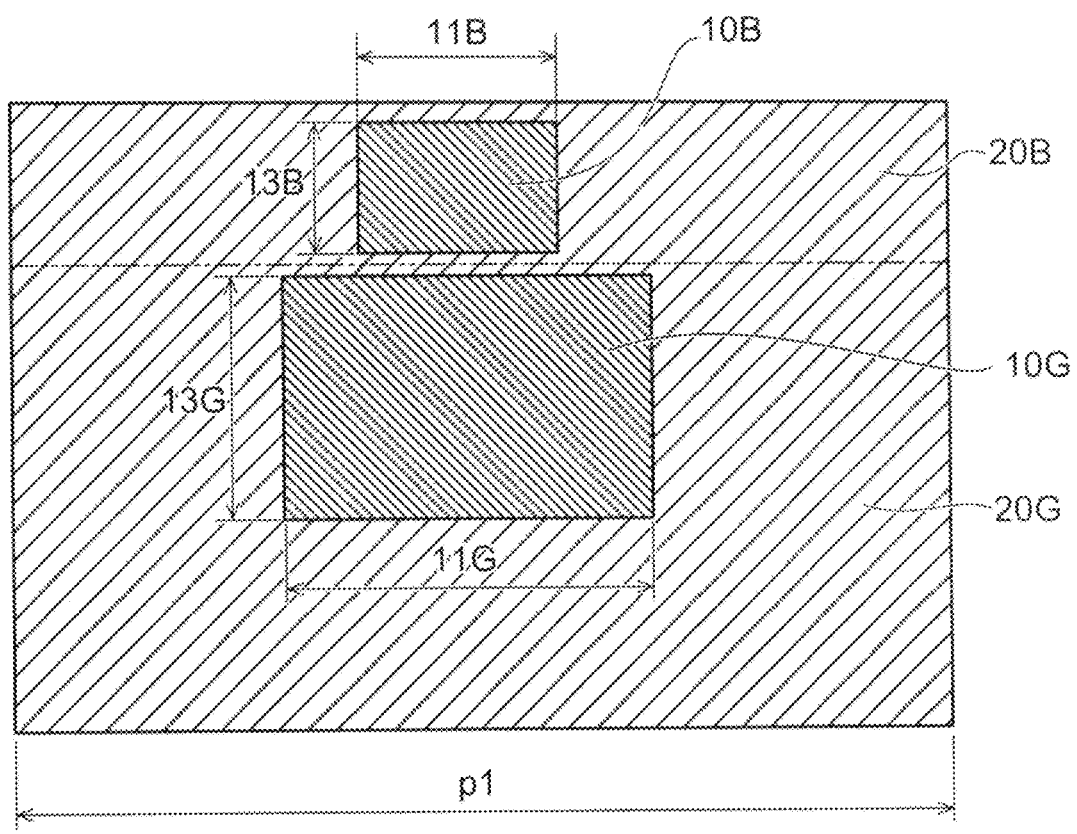
FIG. 6 is a schematic sectional view illustrating a model of the solid-state imaging device in wave simulation about spectral characteristics.

FIG. 6 is a schematic sectional view illustrating a model of the solid-state imaging device in wave simulation about spectral characteristics.

Figure 7A:
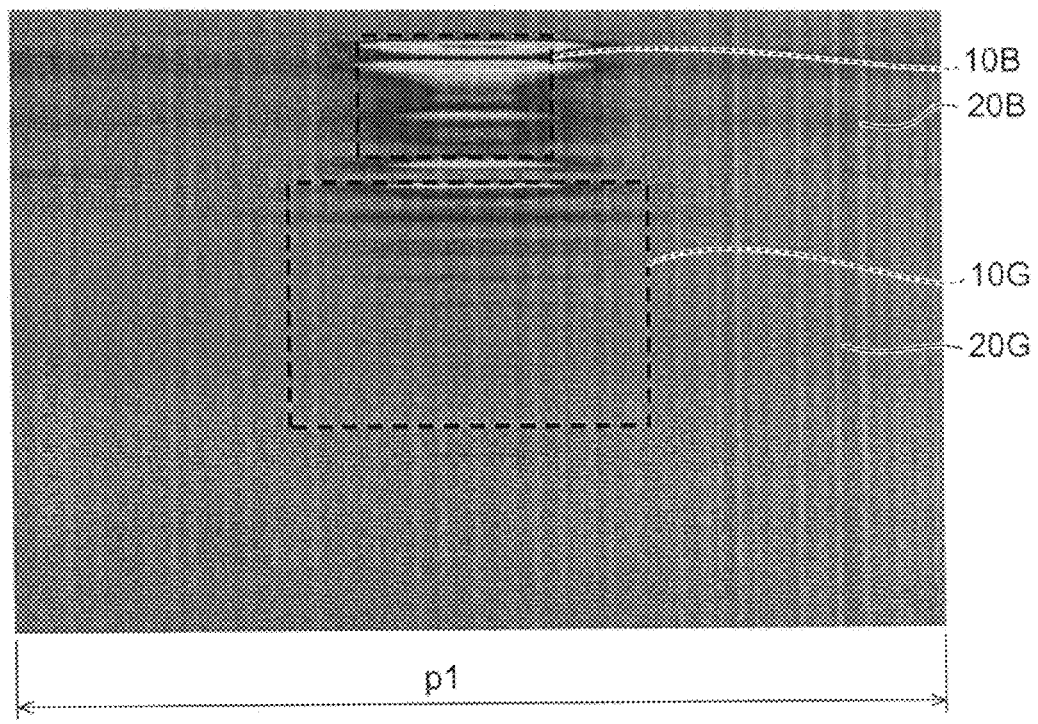
FIG. 7A and FIG. 7B are schematic views illustrating results of the wave simulation about the spectral characteristics.
Figure 7B:
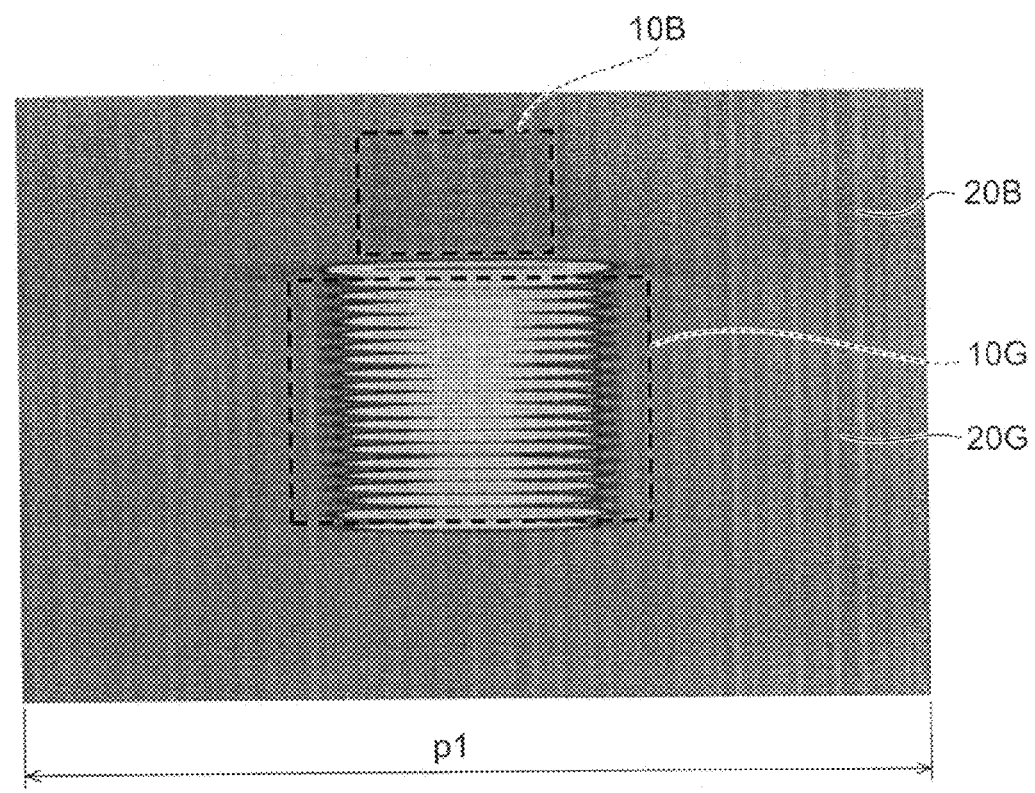

FIG. 7A and FIG. 7B are schematic views illustrating results of the wave simulation about the spectral characteristics.

FIG. 7A is a schematic view illustrating intensity distribution of light having a wavelength of 0.45 μm. FIG. 7B is a schematic view illustrating intensity distribution of light having a wavelength of 0.53 μm.

As shown in FIG. 6, the first photoelectric conversion part 10B and the second photoelectric conversion part 10G of the model in the simulation have the same shape as the model in the simulation described above with reference to FIG. 3A to FIG. 5. That is, the first photoelectric conversion part 10B and the second photoelectric conversion part 10G each have a cylindrical shape. The diameter 11B of the light incidence face of the first photoelectric conversion part 10B is about 0.06 μm. The height 13B of the first photoelectric conversion part 10B is about 1.4 μm. In contrast, the diameter 11G of the light incidence face of the second photoelectric conversion part 10G is about 0.09 μm. The height 13G of the second photoelectric conversion part 10G is about 3.0 μm. In the model shown in FIG. 6, the third photoelectric conversion part 10R is omitted.

Furthermore, the photoelectric conversion part 10 in the simulation is formed of crystalline silicon (Si). The first insulating body 20B and the second insulating body 20G in the simulation are formed of silicon oxide ($SiO_2$). The results of the wave simulation about the spectral characteristics under such conditions are shown in FIG. 7A and FIG. 7B.

That is, in the results of the simulation shown in FIG. 7A and FIG. 7B, the strength (amplitude) of the light incident on the solid-state imaging device 1 during propagation in the first photoelectric conversion part 10B and the second photoelectric conversion part 10G is represented as monotone contrast.

As shown in FIG. 7A, the intensity of the light having the wavelength of 0.45 μm (light LB in the blue band) in the first photoelectric conversion part 10B is higher than that in the second photoelectric conversion part 10G. Therefore, a larger amount of light having the wavelength of 0.45 μm is trapped and absorbed in the first photoelectric conversion part 10B due to the waveguide effect than in the second photoelectric conversion part 10G.

In contrast, as shown in FIG. 7B, the intensity of the light having the wavelength of 0.53 μm (light LG in the green band) in the second photoelectric conversion part 10G is higher than that in the first photoelectric conversion part 10B. Therefore, a larger amount of light having the wavelength of 0.53 μm is trapped and absorbed in the second photoelectric conversion part 10G due to the waveguide effect than in the first photoelectric conversion part 10B.

Also in the simulation, by appropriately setting size of the cylindrical photoelectric conversion part 10, the light LB in the blue band and the light LG in the green band can be separated from each other more efficiently.

As has been described, in the solid-state imaging device 1 according to the embodiment, by appropriately setting size (diameter of the light incidence faces, height or the like) of the cylindrical photoelectric conversion part 10, the optical wavelength band that exhibits a high absorbing property can be changed and the spectral characteristics can be improved. The amount of received light and light-receiving efficiency can be improved.

Next, another embodiment of the invention will be described.

Figure 8:
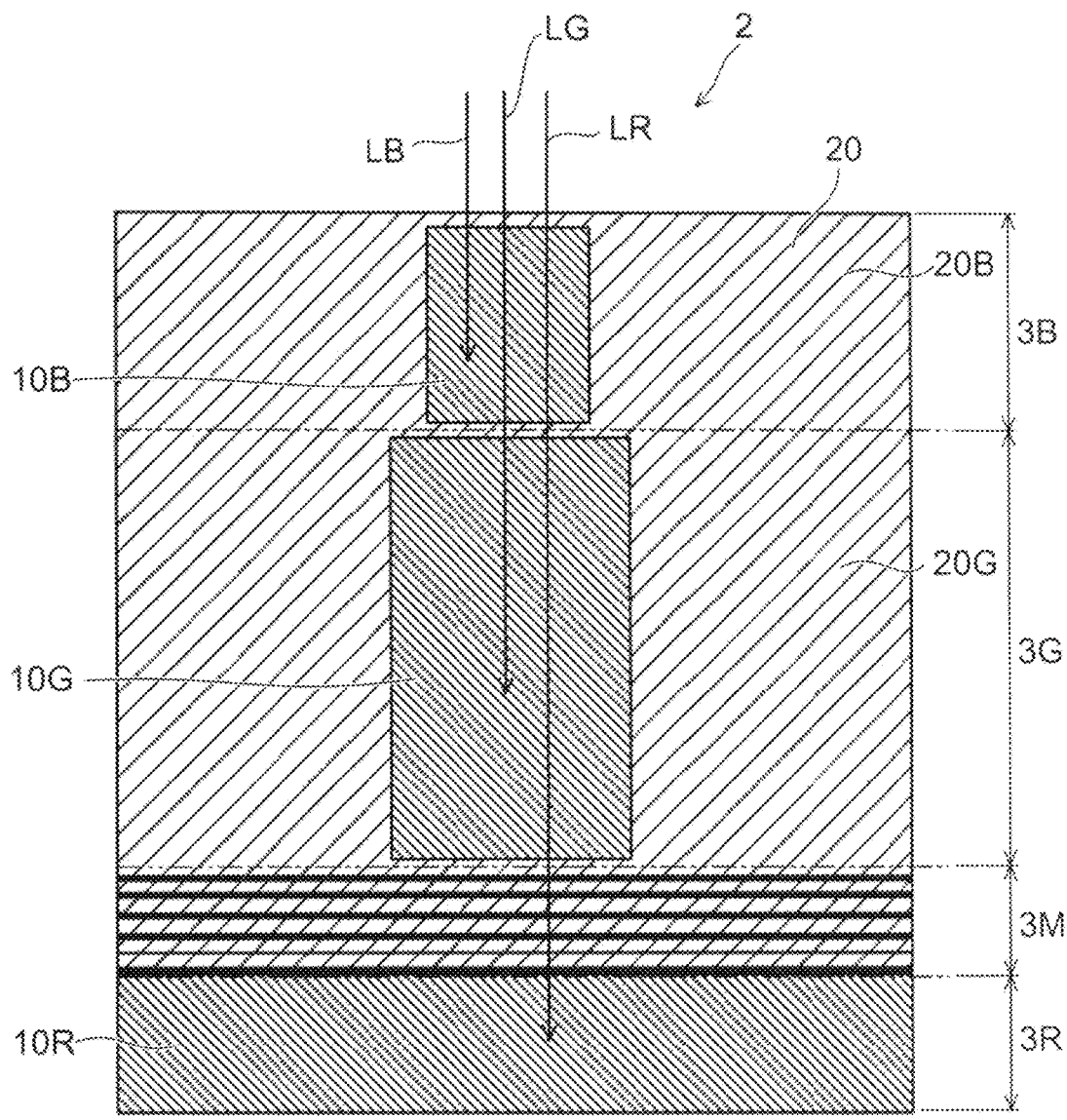
FIG. 8 is a schematic sectional view showing a solid-state imaging device in the embodiment of the invention.

FIG. 8 is a schematic sectional view showing a solid-state imaging device in the embodiment of the invention.

Figure 9:
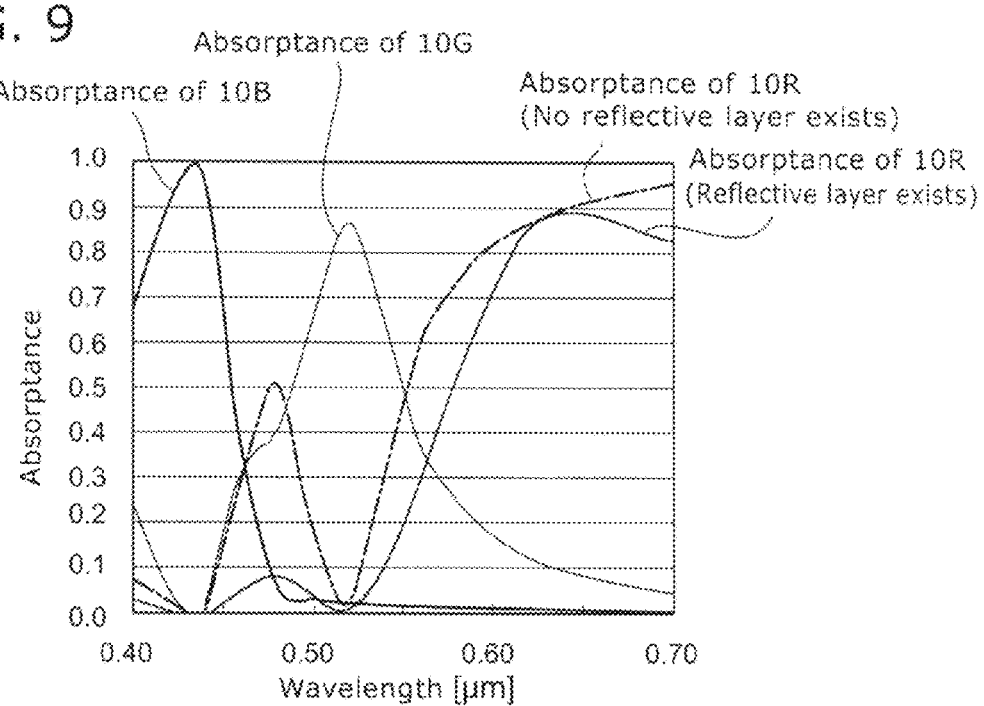
FIG. 9 is a graph illustrating a result of simulation about optical absorptance of the photoelectric conversion part of the solid-state imaging device according to the embodiment.

FIG. 9 is a graph illustrating a result of simulation about optical absorptance of the photoelectric conversion part of the solid-state imaging device according to the embodiment.

Figure 10:
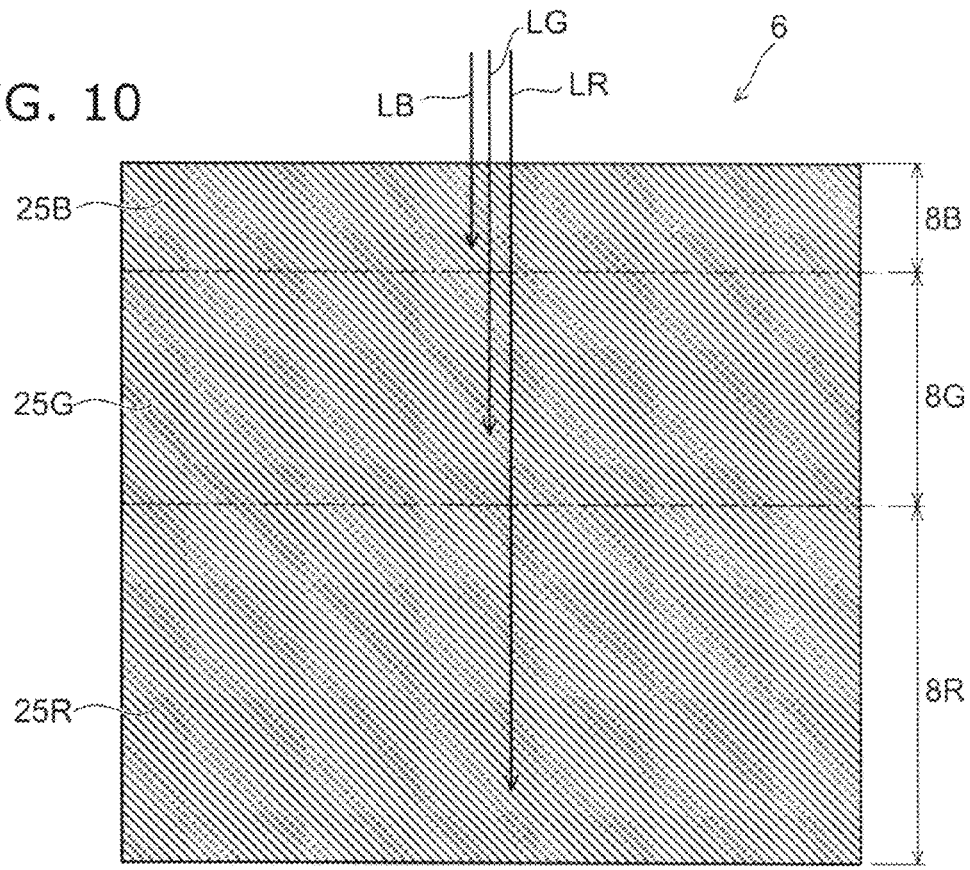
FIG. 10 is a schematic sectional view showing a solid-state imaging device in a comparison example.

FIG. 10 is a schematic sectional view showing a solid-state imaging device in a comparison example.

Figure 11:
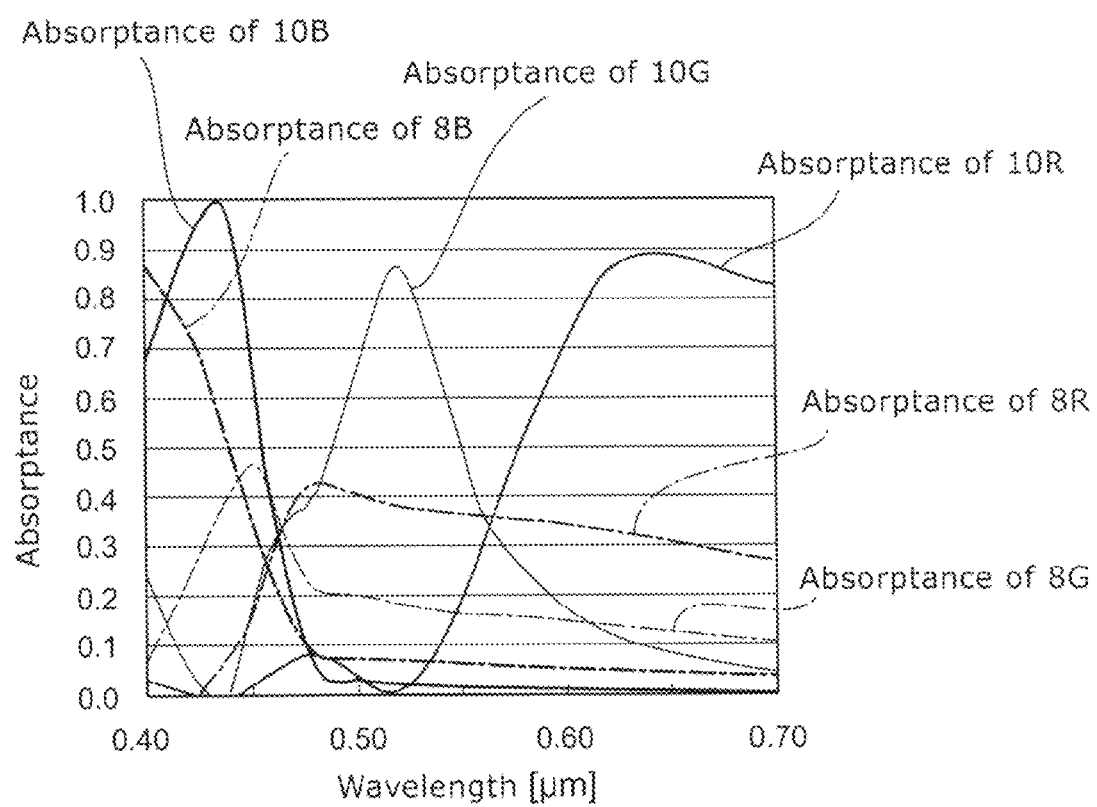
FIG. 11 is a graph illustrating a result of simulation about optical absorptance of the photoelectric conversion part of the solid-state imaging device in the comparison example.

FIG. 11 is a graph illustrating a result of simulation about optical absorptance of the photoelectric conversion part of the solid-state imaging device in the comparison example.

First, the solid-state imaging device 6 in the comparison example will be described with reference to FIG. 10 and FIG. 11.

The solid-state imaging device 6 in the comparison example includes a first layer 8B, a second layer 8G, and a third layer 8R. The first layer 8B is formed of a first silicon 25B. Similarly, the second layer 8G and the third layer 8R are formed of a second silicon 25G and a third silicon 25R, respectively. The first silicon 25B, the second silicon 25G, and the third silicon 25R may be formed of the same material or different materials. Furthermore, the first silicon 25B, the second silicon 25G, and the third silicon 25R may be formed in the same process or different processes.

Some materials have a refractive index that varies in accordance with the wavelength of incident light. For example, silicon has the property that it tends to absorb the light LB in the blue band much more than the light LG in the green band and the light LR in the red band. Through the use of the property or characteristics, the solid-state imaging device 6 in the comparison example controls the amount of absorbed light and separates light. Specifically, solid-state imaging device 6 in the comparison example changes the thickness of silicon forming the first layer 8B, the second layer 8G, and the third layer 8R, thereby controlling the amount of absorbed light and separating the light.

That is, a thickness of the first layer 8B (the first silicon 25B) is smaller than a thickness of the second layer 8G (the second silicon 25G) and a thickness of the third layer 8R (the third silicon 25R). The thickness of the first layer 8B is, for example, about 0.2 μm. A thickness of the second layer 8G (the second silicon 25G) is smaller than the thickness of the first layer 8B (the first silicon 25B) and a thickness of the third layer 8R (the third silicon 25R). The thickness of the second layer 8G is, for example, about 0.6 μm. The thickness of the third layer 8R (the third silicon 25R) is larger than the thickness of the first layer 8B (the first silicon 25B) and the thickness of the second layer 8G (the second silicon 25G). The thickness of the third layer 8R is, for example, about 2.0 μm.

As shown in FIG. 10, the first layer 8B absorbs the light LB in the blue band among light incident on the solid-state imaging device 6 and allows the light in the other wavelength bands (the light LG in the green band and the light LR in the red band) to transmit. The second layer 8G absorbs the light LG in the green band among the light incident on the solid-state imaging device 6 and allows the light in the other wavelength bands (ex. light LR in the red band). The third layer 8R absorbs the light LR in the red band among the light incident on the solid-state imaging device 6.

Here, the inventor has obtained, through the simulation, the optical absorptances of the first layer 8B, the second layer 8G, and the third layer 8R of the solid-state imaging device 6 (model) shown in FIG. 10. A result of the simulation is shown in FIG. 11.

According to the result, light in a wavelength band of not less than about 0.40 μm and less than about 0.45 μm is easier to be absorbed in the first layer 8B than light in the other wavelength bands. The absorptance of the light having a wavelength of about 0.40 μm in the first layer 8B is about 0.85 to 0.87.

Light in a wavelength band of not less than about 0.45 μm and less than about 0.50 μm is easier to be absorbed in the second layer 8G and the third layer 8R than light in the other wavelength bands. A wavelength (about 0.45 μm) at which the optical absorptance reaches a peak in the second layer 8G is relatively close to a wavelength at which the optical absorptance reaches a peak in the third layer 8R. A peak of the optical absorptance in the second layer 8G (about 0.46 to 0.47) is relatively close to a peak of the optical absorptance in the third layer 8R (about 0.43 to 0.44).

As described above, in the solid-state imaging device 6 in the comparison example, light beams in relatively adjacent wavelength regions is absorbed in different layers (the second layer 8G and the third layer 8R). For this reason, in the solid-state imaging device 6 in the comparison example, there is room for improvement of spectral characteristics. Furthermore, the peak of the optical absorptance in the second layer 8G and the third layer 8R is lower than the peak of the optical absorptance in the first layer 8B. This is partially due to that light in the wavelength bands, which is to be absorbed in the second layer 8G and the third layer 8R (the light LG in the green band and the light LR in the red band) is easily absorbed in the first layer 8B. For example, as shown in FIG. 11, the light LG in the green band, which is to be absorbed in the second layer 8G, is also absorbed in the first layer 8B at a relatively high absorptance.

In contrast to this, in a solid-state imaging device 2 according to the embodiment, as shown in FIG. 8, the first photoelectric conversion part 10B and the second photoelectric conversion part 10G are embedded in the first insulating body 20B and the second insulating body 20G, respectively. Furthermore, as described above with reference to FIG. 1, the first photoelectric conversion part 10B and the second photoelectric conversion part 10G have a shape corresponding to the wavelength band of light incident on the solid-state imaging device 1, and are periodically disposed in the first insulating body 20B and the second insulating body 20G, respectively. The third photoelectric conversion part 10R is provided as, for example, a board, in a lower portion of the solid-state imaging device 2. The structure is the same as the structure of the solid-state imaging device 1 as described above with reference to FIG. 1 and FIG. 2.

The solid-state imaging device 2 according to the embodiment includes a reflective layer 3M provided between the second photoelectric conversion part 10G and the third photoelectric conversion part 10R. The reflective layer 3M has, for example, an upper reflective layer and a lower reflective layer. The upper reflective layer has a stacked structure formed of a first layer and a second layer, which are different from each other in terms of refractive index. The number of stacked first layers and second layers is optional.

A control layer is provided between the upper reflective layer and the lower reflective layer. The thickness (including zero) or refractive index of the control layer varies according to transmission wavelength. In the case where the thickness of the control layer is zero, that is, no control layer is provided, a stacked body formed of the first layer adjacent to the boundary between the upper reflective layer and the lower reflective layer functions as the control layer.

In the solid-state imaging device 2 according to the embodiment, light passing through the reflective layer 3M is mainly the light LR in the red band. For this reason, by appropriately designing the thickness and the refractive index of the control layer according to wavelength of the light in the red band, the reflective layer 3M allows only light having a particular wavelength among light multi-reflected on reflection surfaces of the upper reflective layer and the lower reflective layer to transmit. That is, the reflective layer 3M can reduce mixed color.

The first layer, the second layer, and the control layer of the reflective layer 3M are made of an inorganic material. Examples of the inorganic material include titanium oxide ($TiO_2$), silicon oxide ($SiO_2$), silicon nitride (SiN), silicon (Si), polycrystalline silicon, and amorphous silicon.

Here, the inventor has obtained, through the simulation, optical absorptances of the first photoelectric conversion part 10B, the second photoelectric conversion part 10G, and the third photoelectric conversion part 10R of the solid-state imaging device 2 (model) shown in FIG. 8. A result of the simulation is shown in FIG. 9 and FIG. 11. As shown in FIG. 9, in the case where no reflective layer 3M is provided, the light in the wavelength band of not less than about 0.45 μm and less than about 0.50 μm (light in the blue to green bands) transmits the second structure part 3G, and is absorbed by the third photoelectric conversion part 10R at a relatively large absorptance. In contrast to this, in the case where the reflective layer 3M is provided, that is, in the solid-state imaging device 2 according to the embodiment, the reflective layer 3M allows only light having a particular wavelength (the light LR in the red band) to transmit. For this reason, as shown in FIG. 9, a ratio at which the light in the wavelength band of not less than about 0.45 μm and less than about 0.50 μm (light in the blue to green bands) is absorbed by the third photoelectric conversion part 10R (absorptance) can be reduced. This can further improve spectral characteristics.

Furthermore, as shown in FIG. 11, the absorptance at which the third photoelectric conversion part 10R absorbs light in a wavelength band of not less than about 0.60 μm and less than about 0.70 μm is higher than the absorptance at which the third photoelectric conversion part 10R absorbs light in the other wavelength bands. In other words, the light in the wavelength band of not less than about 0.60 μm and less than about 0.70 μm is easier to be absorbed in the third photoelectric conversion part 10R than the light in the other wavelength bands. Moreover, the optical absorptance of the photoelectric conversion part 10 in the embodiment is higher than the optical absorptance of the first layer 8B, the second layer 8G, and the third layer 8R in the comparison example. The light in the wavelength band of not less than about 0.45 μm and less than about 0.50 μm and the light in the wavelength band of not less than about 0.50 μm and less than about 0.60 μm are described above with reference to FIG. 4. Therefore, the solid-state imaging device 2 according to the embodiment can further improve the spectral characteristics, and improve the amount of received light and the light-receiving efficiency as well.

Next, specific examples of the photoelectric conversion part in the embodiment will be described with reference to figures.

Figure 12A:
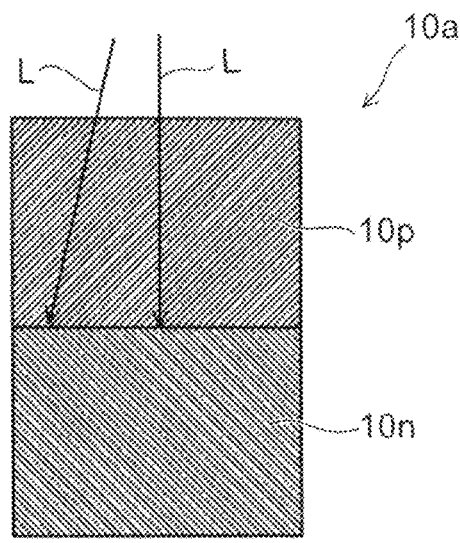
FIG. 12A to FIG. 12C are schematic sectional views illustrating specific examples of the photoelectric conversion part in the embodiment.
Figure 12B:
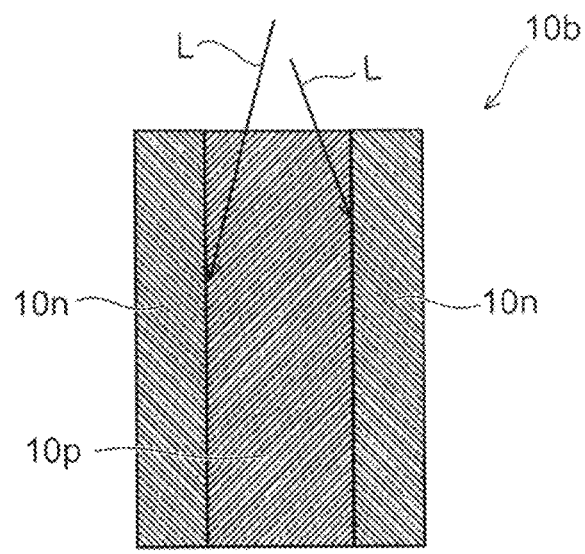
Figure 12C:
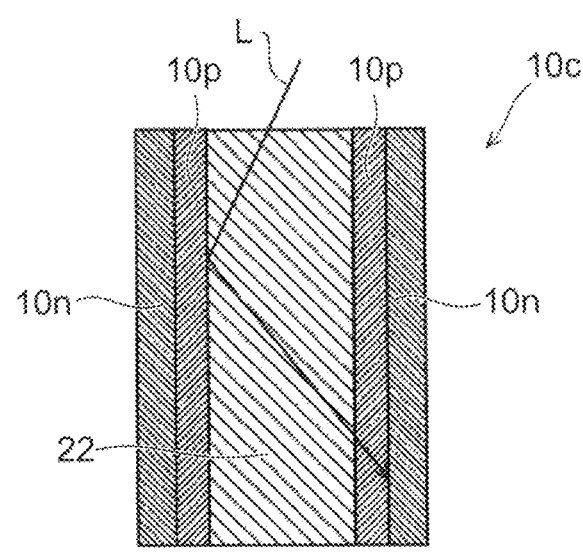

FIG. 12A to FIG. 12C are schematic sectional views illustrating specific examples of the photoelectric conversion part in the embodiment.

As described above with reference to FIG. 1 and FIG. 2, the photodiode used as the photoelectric conversion part 10 has a PN-junction. The first photoelectric conversion part 10B and the second photoelectric conversion part 10G each have a pillar shape. Here, the case where the first photoelectric conversion part 10B and the second photoelectric conversion part 10G each have a cylindrical shape is described.

A photoelectric conversion part 10a shown in FIG. 12A has a p-type layer 10p provided in an upper portion and an n-type layer 10n provided in a lower portion. As shown in FIG. 12A, light L incident in a vertical or diagonal direction to the light incidence face is absorbed in mainly a PN junction, and is efficiently photoelectrically-converted.

A photoelectric conversion part 10b shown in FIG. 12B has the p-type layer 10p provided at the center of the cylinder and the n-type layer 10n provided around the p-type layer 10p. As shown in FIG. 12B, the light L incident in a diagonal direction to the light incidence face is absorbed in mainly the PN junction, and is efficiently photoelectrically-converted.

A photoelectric conversion part 10c shown in FIG. 12C has an insulating body 22 provided at the center of the cylinder, the p-type layer 10p provided around the insulating body 22, and the n-type layer 10n provided around the p-type layer 10p. The insulating body 22 is formed of, for example, silicon oxide ($SiO_2$). The light L incident from the upper face (frontage) of the insulating body 22 propagates in the insulating body 22, is absorbed in mainly the PN junction, and is efficiently photoelectrically-converted.

Next, a specific example of an electrode will be described with reference to figures.

Figure 13:
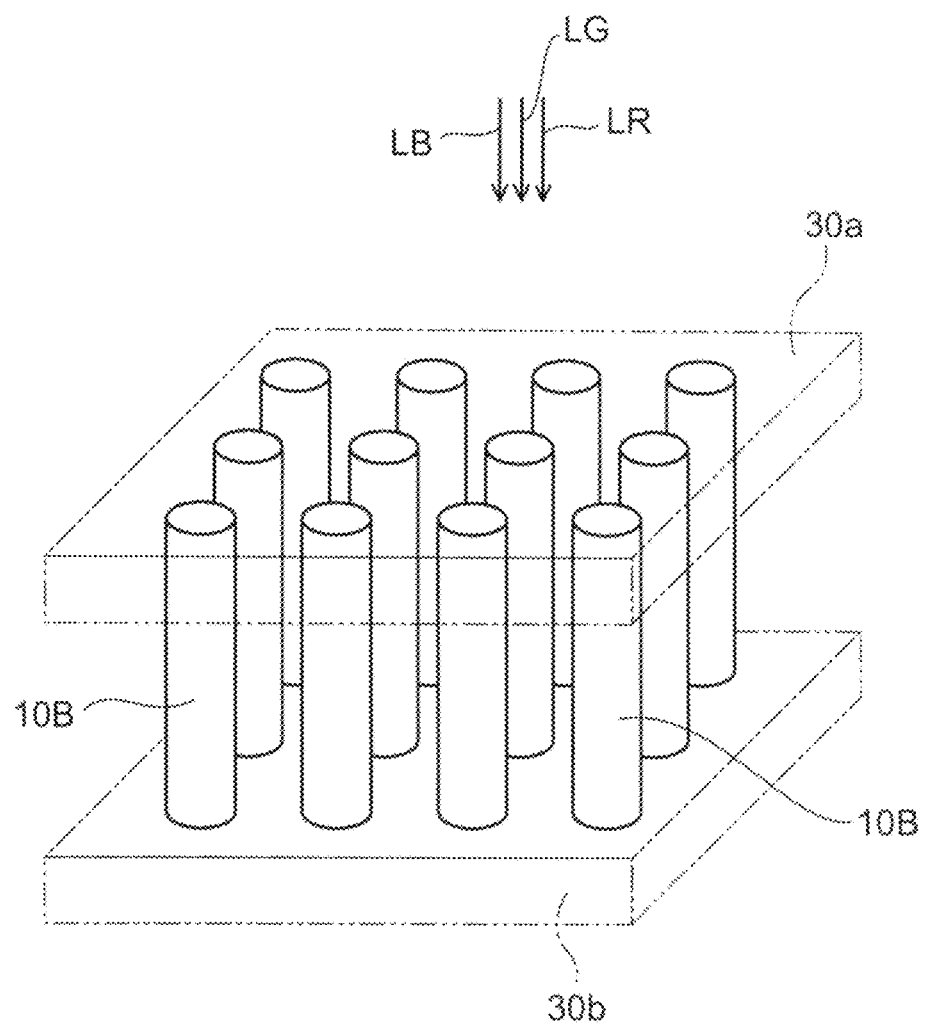
FIG. 13 is a schematic perspective view illustrating the specific example of the electrode in the embodiment.

FIG. 13 is a schematic perspective view illustrating the specific example of the electrode in the embodiment.

In the solid-state imaging device according to the embodiment, an electric signal (pixel signal) caused by photoelectric conversion in the photoelectric conversion part 10 is sent to a peripheral circuit, and a reverse bias voltage is applied to the photoelectric conversion part 10. For this reason, in the solid-state imaging device according to the embodiment, an electrode is required to be arranged.

In the specific example shown in FIG. 13, a transparent electrodes having translucency to light incident on the solid-state imaging device is provided. For example, the transparent electrode formed of an indium tin oxide (ITO) film is disposed above and below the first photoelectric conversion part 10B. Specifically, a first transparent electrode 30a is disposed above the first photoelectric conversion part 10B, and is connected to the first photoelectric conversion part 10B. Furthermore, a second transparent electrode 30b is disposed below the first photoelectric conversion part 10B, and is connected to the first photoelectric conversion part 10B. That is, the first transparent electrode 30a and the second transparent electrode 30b are provided so as to sandwich the first photoelectric conversion part 10B in the light incidence direction. The transparent electrode has translucency to light incident on the solid-state imaging device or light propagating in the photoelectric conversion part.

Although, in the specific example shown in FIG. 13, the electrode connected to the first photoelectric conversion part 10B is taken as an example for explanation, arrangement of the first transparent electrode 30a and the second transparent electrode 30b is also applied to electrode connected to the second photoelectric conversion part 10G and the third photoelectric conversion part 10R.

Figure 14:
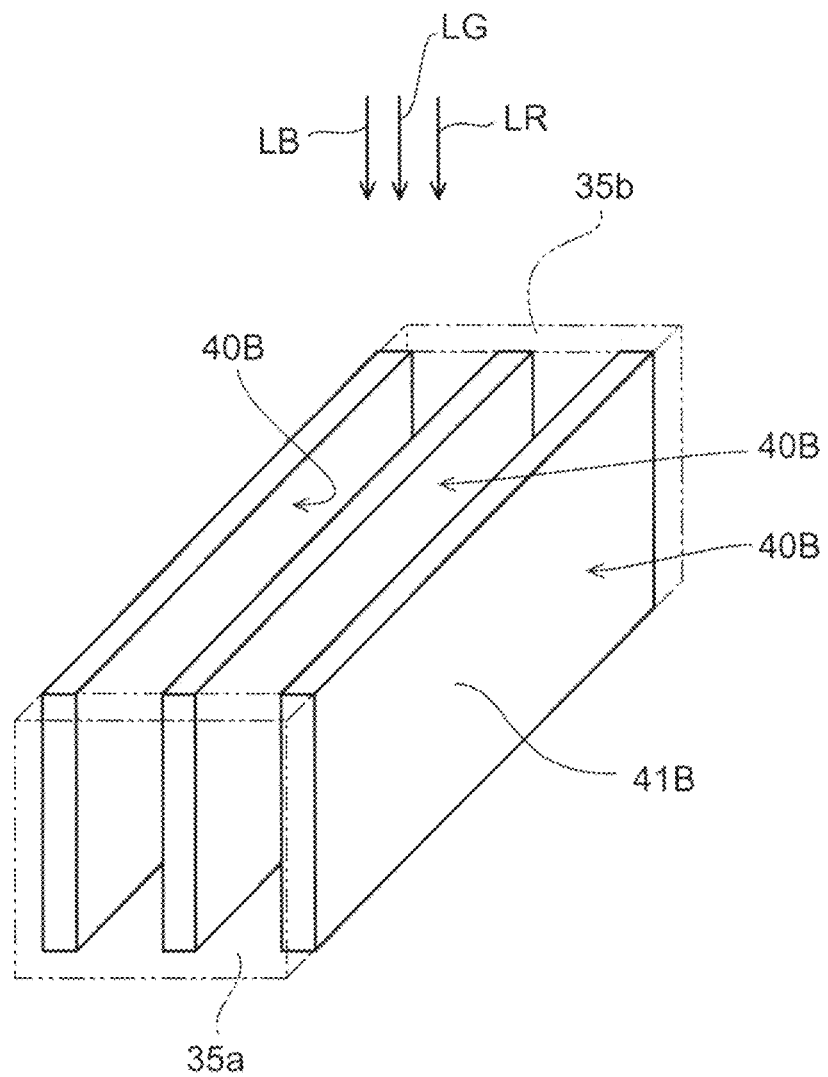
FIG. 14 is a schematic perspective view illustrating another specific example of the electrodes in the embodiment.

FIG. 14 is a schematic perspective view illustrating another specific example of the electrodes in the embodiment.

In the specific example shown in FIG. 14, the first photoelectric conversion part 40B has a prismatic shape, specifically, a plate-like shape. Then, a normal direction of a surface 41B of the first photoelectric conversion part 40B is substantially vertical to the light incidence direction. In other words, the first photoelectric conversion part 40B is disposed such that the surface 41B substantially follows the light incidence direction. For this reason, light incident on the solid-state imaging device proceeds from an upper face (frontage) of the first photoelectric conversion part 40B into the first photoelectric conversion part 40B.

In the specific example, electrodes are provided at both ends of the first photoelectric conversion part 40B. Specifically, a first electrode 35a is disposed on one side face that is orthogonal to the surface 41B of the first photoelectric conversion part 40B and is parallel to the light incidence direction, and is connected to the first photoelectric conversion part 40B. A second electrode 35b is disposed on the other side face that is orthogonal to the surface 41B of the first photoelectric conversion part 40B and is parallel to the light incidence direction, and is connected to the first photoelectric conversion part 40B.

The first electrode 35a and the second electrode 35b in the specific example are not limited to the transparent electrode. Furthermore, although the electrode connected to the first photoelectric conversion part 40B is used in the specific example shown in FIG. 13, arrangement of the first electrode 35a and the second electrode 35b is also applied to the electrode connected to the second photoelectric conversion part and the third photoelectric conversion part.

Next, shape and arrangement of the photoelectric conversion part in the embodiment will be described with reference to figures.

Figure 15A:
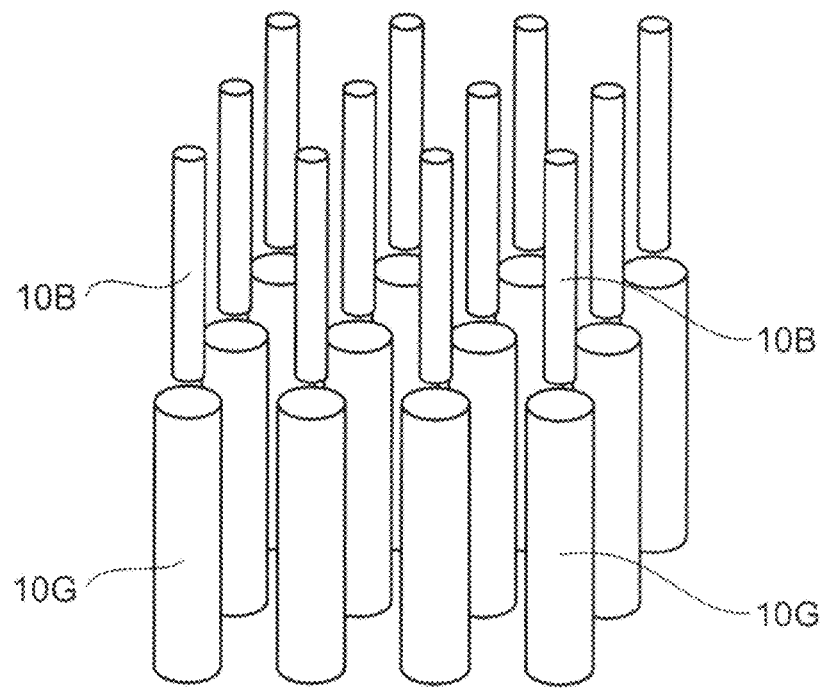
FIG. 15A and FIG. 15B are schematic perspective views illustrating the shape and arrangement of the photoelectric conversion part in the embodiment.
Figure 15B:
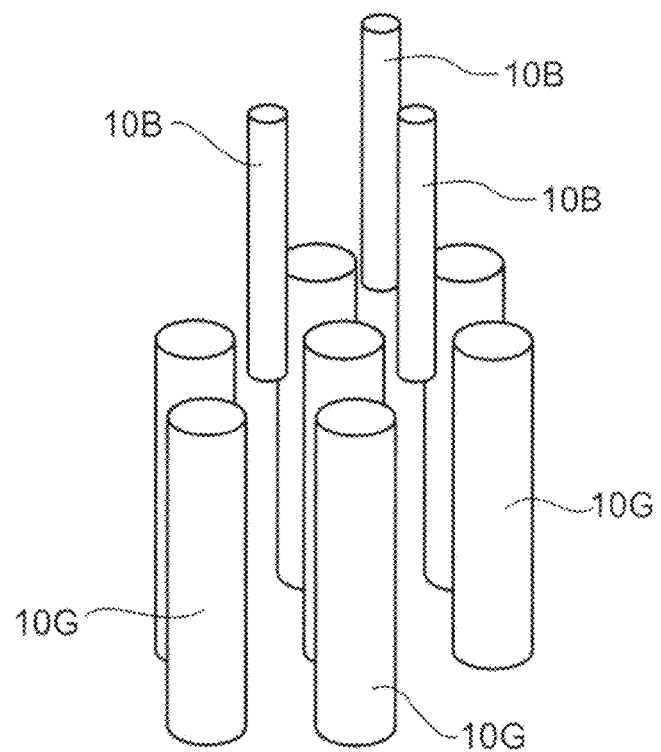

FIG. 15A and FIG. 15B are schematic perspective views illustrating the shape and arrangement of the photoelectric conversion part in the embodiment.

FIG. 15A is a schematic perspective view showing a state where the photoelectric conversion part in the embodiment is squarely disposed. FIG. 15B is a schematic perspective view showing a state where the photoelectric conversion part in the embodiment is hexagonally disposed.

In the specific examples shown in FIG. 15A and FIG. 15B, the first photoelectric conversion part 10B and the second photoelectric conversion part 10G each have a cylindrical shape.

In the specific example shown in FIG. 15A, the first photoelectric conversion part 10B is periodically disposed in a grid manner. In other words, the first photoelectric conversion part 10B is periodically squarely-disposed. Then, the second photoelectric conversion part 10G is disposed below the first photoelectric conversion part 10B. At this time, a cylindrical axis of the second photoelectric conversion part 10G is substantially disposed on a cylindrical axis of the first photoelectric conversion part 10B. That is, the period p1 at which the first photoelectric conversion part 10B is disposed is the same as the period p1 at which the second photoelectric conversion part 10G is disposed. For this reason, like the first photoelectric conversion part 10B, the second photoelectric conversion part 10G is periodically disposed in a grid manner, that is, are squarely-disposed.

In the specific example shown in FIG. 15B, the first photoelectric conversion part 10B and the second photoelectric conversion part 10G are periodically disposed in a honeycomb manner. The first photoelectric conversion part 10B is provided above the second photoelectric conversion part 10G, and among the three adjacent second photoelectric conversion parts 10G. That is, the first photoelectric conversion part 10B and the second photoelectric conversion part 10G are periodically hexagonally-disposed.

FIG. 16A to FIG. 16D are schematic perspective views illustrating modifications of shape of the photoelectric conversion part in the embodiment.

Here, the first photoelectric conversion part is described as examples. The shape of the second photoelectric conversion part is the same as that of the first photoelectric conversion part.

A first photoelectric conversion part 50B in the specific example shown in FIG. 16A has a pyramidal shape, specifically, a conical shape. However, the shape of the first photoelectric conversion part 50B is not limited to the conical shape, and may be, for example, hexagonal pyramid or four-sided pyramid. A first photoelectric conversion part 60B in the specific example shown in FIG. 16B has a prismatic shape, specifically a hexagonal prismatic shape. However, the shape of the first photoelectric conversion part 60B is not limited to the hexagonal prismatic shape, and may be, for example, a triangular prismatic shape or a pentagonal prismatic shape. Then, the first photoelectric conversion part 50B shown in FIG. 16A and the first photoelectric conversion part 60B shown in FIG. 16B are squarely disposed as described with reference to FIG. 15A or hexagonally disposed as described with reference to FIG. 15B. Furthermore, as described above with reference to FIG. 1 and FIG. 2, a longitudinal direction of the first photoelectric conversion part 50B is substantially parallel to the light incidence direction. For this reason, the modification includes a case where a bottom face (for example, circular face) of the first photoelectric conversion part 50B is disposed on an incidence side, and a case where the bottom face of the first photoelectric conversion part 50B is disposed on an output side.

The first photoelectric conversion part 40B in the specific example shown in FIG. 16C has a four-sided prismatic shape, specifically, a plate-like shape. Then, the first photoelectric conversion part 40B having a plate-like shape is disposed in parallel, that is, is disposed in a line or stripe manner. The first photoelectric conversion part 70B in the specific example shown in FIG. 16D has a structure in which the plate-like first photoelectric conversion part 70B is disposed crosswise, that is, a lattice structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
    a first structure part including a first insulating body and a first photoelectric conversion part, the first photoelectric conversion part being periodically disposed in the first insulating body, the first photoelectric conversion part having a shape corresponding to a first wavelength band, the first photoelectric conversion part selectively absorbing light in the first wavelength band due to a waveguide effect;
    a second structure part including a second insulating body and a second photoelectric conversion part, the second photoelectric conversion part being periodically disposed in the second insulating body, the second photoelectric conversion part having a shape corresponding to a second wavelength band, the second photoelectric conversion part selectively absorbing light in the second wavelength band due to the waveguide effect, the second wavelength band being different from the first wavelength band; and
    a third structure part including a third photoelectric conversion part, the third photoelectric conversion part absorbing light in a third wavelength band, the third wavelength band being different from the first wavelength band and the second wavelength band,
    wherein:
    when viewed in the light incidence direction, the first photoelectric conversion part, the second photoelectric conversion part, and the third photoelectric conversion part are disposed in this order;
    an arrangement period of the first photoelectric conversion part is the same as an arrangement period of the second photoelectric conversion part;
    a size of the first photoelectric conversion part is different from a size of the second photoconversion part and a size of the third photoelectric conversion part; and
    the size of the second photoelectric conversion part is different from the size of the third photoelectric conversion part.

2. The device according to claim 1, wherein
    the first photoelectric conversion part and the second photoelectric conversion part each have a pillar shape, and
    a longitudinal direction of the pillar shape is parallel to the incidence direction.

3. The device according to claim 2, wherein
    the pillar shape is a cylindrical shape.

4. The device according to claim 2, wherein
    the pillar shape is a conical shape.

5. The device according to claim 2, wherein
    the pillar shape is a prismatic shape.

6. The device according to claim 2, wherein
    the pillar shape is a pyramid-like shape.

7. The device according to claim 2, wherein
    the pillar shape is a cylindrical shape, and
    a diameter of the cylindrical shape of the second photoelectric conversion part is 1.5 times as large as a diameter of the cylindrical shape of the first photoelectric conversion part.

8. The device according to claim 2, wherein
    the pillar shape is a cylindrical shape, and
    a diameter of the cylindrical shape of the first photoelectric conversion part is 0.06 micrometer, and a height of the cylindrical shape of the first photoelectric conversion part is 1.4 micrometer.

9. The device according to claim 2, wherein
    the pillar shape is a cylindrical shape, and
    a diameter of the cylindrical shape of the second photoelectric conversion part is 0.09 micrometer, and a height of the cylindrical shape of the second photoelectric conversion part is 3.0 micrometer.

10. The device according to claim 1, wherein
    each of the first photoelectric conversion part and the second photoelectric conversion part is squarely disposed.

11. The device according to claim 1, wherein
    each of the first photoelectric conversion part and the second photoelectric conversion part is hexagonally disposed.

12. The device according to claim 1, wherein
    each of the first photoelectric conversion part and the second photoelectric conversion part has a plate-like shape and is disposed in a stripe manner, and
    a normal direction of a surface of the plate-like shape is orthogonal to the incidence direction.

13. The device according to claim 1, wherein
    each of the first photoelectric conversion part and the second photoelectric conversion part has a plate-like shape and is disposed crosswise, and
    a normal direction of a surface of the plate-like shape is orthogonal to the incidence direction.

14. The device according to claim 1, wherein
    the third photoelectric conversion part has a bulk structure.

15. The device according to claim 1, further comprising a transparent electrode, the transparent electrode transmitting an electric signal from each of the first photoelectric conversion part, the second photoelectric conversion part, and the third photoelectric conversion part, the transparent electrode having translucency to the light,
    the transparent electrode being disposed so as to sandwich the first photoelectric conversion part, the second photoelectric conversion part, and the third photoelectric conversion part in the incidence direction.

16. The device according to claim 12, further comprising an electrode, the electrode transmitting an electric signal from each of the first photoelectric conversion part, the second photoelectric conversion part, and the third photoelectric conversion part, the electrode having translucency to the light,
    the electrode being disposed on both sides orthogonal to a surface of the plate-like shape.

17. The device according to claim 13, further comprising an electrode, the electrode transmitting an electric signal from each of the first photoelectric conversion part, the second photoelectric conversion part, and the third photoelectric conversion part, the electrode having translucency to the light,
the electrode being disposed on both sides orthogonal to a surface of the plate-like shape.

18. The device according to claim 1, wherein
the first wavelength band is a wavelength band of not less than 0.40 micrometer and less than 0.50 micrometer,
the second wavelength band is a wavelength band of not less than 0.50 micrometer and less than 0.60 micrometer, and
the third wavelength band is a wavelength band of not less than 0.60 micrometer and less than 0.70 micrometer.

19. The device according to claim 1, wherein
the first photoelectric conversion part, the second photoelectric conversion part, and the third photoelectric conversion part each are formed of a semiconductor material selected from the group consisting of silicon, polycrystalline silicon, amorphous silicon, and germanium.

* * * * *